United States Patent
Mizusaki et al.

(10) Patent No.: US 11,112,299 B2
(45) Date of Patent: Sep. 7, 2021

(54) SMALL PHOTOELECTRIC SENSOR

(71) Applicant: OMRON Corporation, Kyoto (JP)

(72) Inventors: Hiroyuki Mizusaki, Kyoto (JP);
Tomohiro Tsuji, Kyoto (JP)

(73) Assignee: OMRON Corporation, Kyoto (JP)

( * ) Notice: Subject to any disclaimer, the term of this patent is extended or adjusted under 35 U.S.C. 154(b) by 45 days.

(21) Appl. No.: 16/275,321

(22) Filed: Feb. 14, 2019

(65) Prior Publication Data

US 2019/0285463 A1    Sep. 19, 2019

(30) Foreign Application Priority Data

Mar. 15, 2018 (JP) .............................. JP2018-047510

(51) Int. Cl.
| | | |
|---|---|---|
| *G01J 1/02* | (2006.01) | |
| *G01J 1/04* | (2006.01) | |
| *G01S 7/481* | (2006.01) | |
| *G01V 8/14* | (2006.01) | |
| *G02B 7/00* | (2021.01) | |

(Continued)

(52) U.S. Cl.
CPC ........... *G01J 1/0271* (2013.01); *G01J 1/0204* (2013.01); *G01J 1/0403* (2013.01); *G01J 1/0407* (2013.01); *G01J 1/0411* (2013.01); *G01S 7/4813* (2013.01); *G01S 17/04* (2020.01); *G01V 8/12* (2013.01);

(Continued)

(58) Field of Classification Search
CPC ...... G01J 1/0271; G01J 1/0204; G01J 1/0403; G01J 1/0407; G01J 1/0411; G01J 1/42; G01S 17/04; G01S 7/4813; G02B 7/00; H01L 2224/00
See application file for complete search history.

(56) References Cited

U.S. PATENT DOCUMENTS

| | | | | |
|---|---|---|---|---|
| 4,808,812 A | * | 2/1989 | Tanaka | ................ H01L 31/0203 |
| | | | | 250/216 |
| 7,400,463 B1 | * | 7/2008 | Wu | ...................... G02B 13/001 |
| | | | | 359/819 |

(Continued)

FOREIGN PATENT DOCUMENTS

| | | |
|---|---|---|
| CN | 1953221 | 4/2007 |
| CN | 103481512 | 1/2014 |

(Continued)

OTHER PUBLICATIONS

"Search Report of Europe Counterpart Application", dated Jul. 30, 2019, pp. 1-7.

(Continued)

*Primary Examiner* — Que Tan Le
*Assistant Examiner* — Don J Williams
(74) *Attorney, Agent, or Firm* — JCIPRNET

(57) ABSTRACT

The disclosure provides a small photoelectric sensor that can secure a capacity for accommodating optical components and secure sealing properties. The small photoelectric sensor includes a holder in which an opening, an edge that defines the opening, and four fixing parts that are independently provided at four corners of a front surface are formed on the front surface; a cover lens that is provided at a position interposed between the four fixing parts, and is connected to the edge in a region overlapping the edge; and an optical component that is held by the holder and projects or receives light through the opening.

9 Claims, 5 Drawing Sheets

(51) Int. Cl.
*G01V 8/12* (2006.01)
*G01S 17/04* (2020.01)
*G01J 1/42* (2006.01)

(52) U.S. Cl.
CPC .............. *G01V 8/14* (2013.01); *G02B 7/00* (2013.01); *G01J 1/42* (2013.01); *H01L 2224/00* (2013.01)

(56) References Cited

U.S. PATENT DOCUMENTS

| | | | |
|---|---|---|---|
| 7,505,215 B2 * | 3/2009 | Sanou | H04N 5/2254 |
| | | | 359/694 |
| 2010/0246370 A1 | 9/2010 | Iijima et al. | |
| 2010/0277800 A1 * | 11/2010 | Wu | G02B 27/0006 |
| | | | 359/513 |

FOREIGN PATENT DOCUMENTS

| | | |
|---|---|---|
| CN | 203881334 | 10/2014 |
| CN | 107152940 | 9/2017 |
| DE | 102014216958 | 7/2015 |
| EP | 2671705 | 12/2013 |
| EP | 3213860 | 9/2017 |
| EP | 3214418 | 9/2017 |
| JP | H0277831 | 6/1990 |
| JP | H0572027 | 9/1993 |
| JP | 2013211152 | 10/2013 |
| JP | 2015172564 | 10/2015 |

OTHER PUBLICATIONS

"Office Action of Europe Counterpart Application", dated Aug. 14, 2020, p. 1-p. 6.
"Office Action of China Counterpart Application", dated Aug. 7, 2020, with English translation thereof, p. 1-p. 12.
"Office Action of Japan Counterpart Application," with English translation thereof, dated Dec. 8, 2020, p. 1-p. 6.

* cited by examiner

SMALL PHOTOELECTRIC SENSOR

CROSS-REFERENCE TO RELATED APPLICATION

This application claims the priority of Japan patent application serial no. 2018-047510, filed on Mar. 15, 2018. The entirety of the above-mentioned patent application is hereby incorporated by reference herein and made a part of this specification.

BACKGROUND

Technical Field

The disclosure relates to a small photoelectric sensor.

Description of Related Art

As a photoelectric sensor configured to detect whether there is an object, there is a small photoelectric sensor that is miniaturized so that it can cope with various detection environments and installation places. For example, in the following Patent Document 1, a retroreflective type photoelectric sensor in which light projecting units and light receiving units are disposed in parallel, and light is projected toward a reflection plate installed to face the light projecting and receiving units with a detection region therebetween is disclosed.

A small photoelectric sensor includes optical components such as a light projecting unit and a light receiving unit, and the optical components are held by a holder. Here, in the holder, an opening through which light is projected and received by optical components is provided, and the opening is sealed by a cover lens. Here, the cover lens may be a low-distortion plate-like lens according to optical requirements and may be connected to the holder on the plane. In such a case, the cover lens is disposed so that it overlaps an edge that defines the opening of the holder and may be connected to the edge by laser welding, ultrasonic welding, or the like.

However, if the outer shape of the holder is made smaller in order to make the photoelectric sensor smaller, a capacity for accommodating optical components (in other words, a volume of a space for accommodating optical components) is also reduced, and there is a limitation on the size of the optical components that can be accommodated. Here, it is conceivable to narrow the width of the edge that defines the opening so that the capacity for accommodating optical components increases. However, when a sufficient width of the edge is not secured, there is a risk of insufficient connection between the cover lens and the holder, and it becomes difficult to secure sealing properties.

PATENT DOCUMENTS

[Patent Document 1] Japanese Laid-open No. 2015-172564

SUMMARY

A small photoelectric sensor according to an aspect of the disclosure includes a holder in which an opening, an edge that defines the opening, and four fixing parts that are independently provided at four corners of a front surface are formed on the front surface; a cover lens that is provided at a position interposed between the four fixing parts, and is connected to the edge in a region overlapping the edge; and an optical component that is held by the holder and projects or receives light through the opening.

DESCRIPTION OF THE EMBODIMENTS

Figure 1:
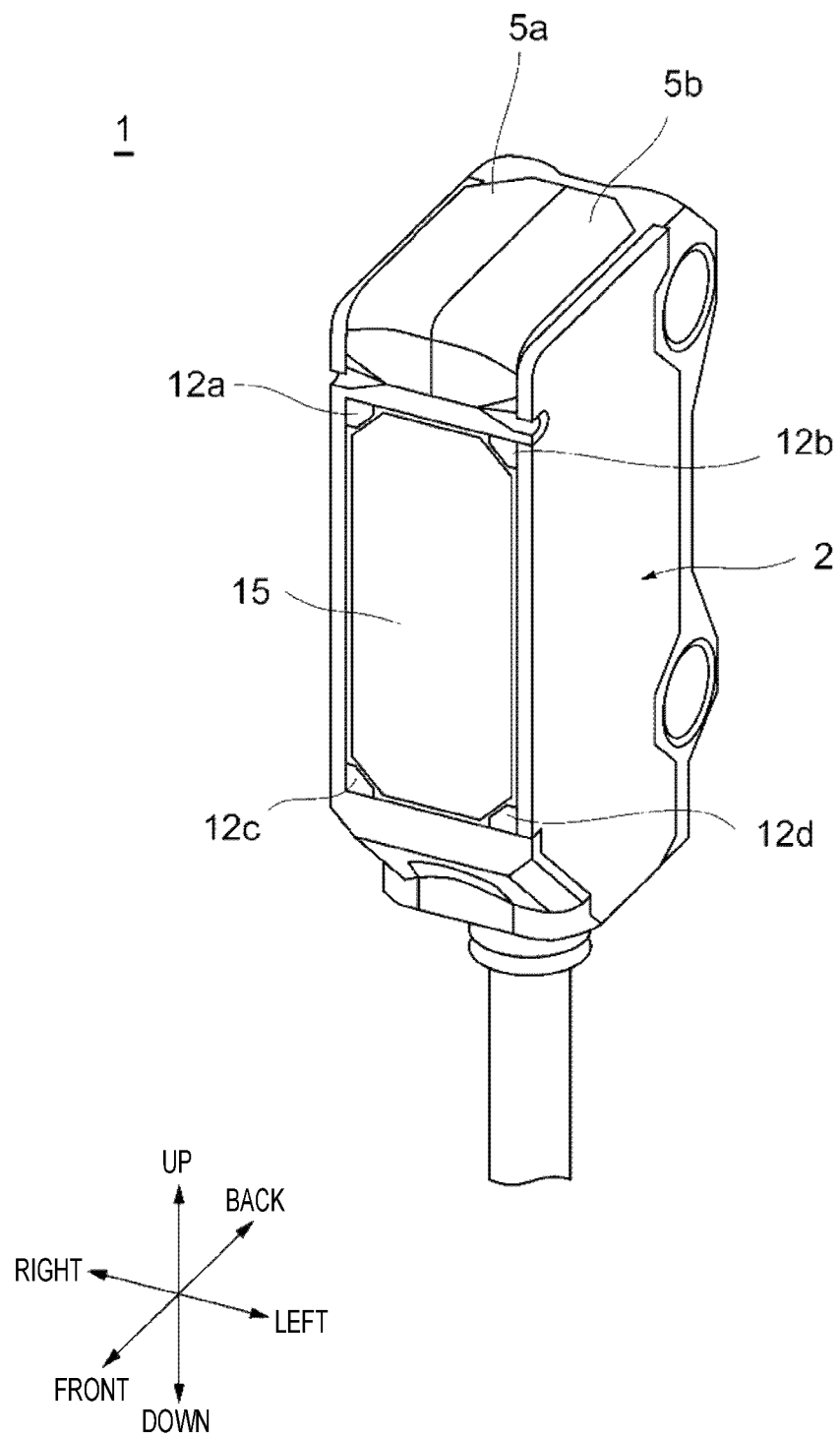
FIG. 1 is a perspective view showing a small photoelectric sensor according to an embodiment.

An objective of the disclosure is to provide a small photoelectric sensor that can secure a capacity for accommodating an optical component and securing sealing properties.

A small photoelectric sensor according to an aspect of the disclosure includes a holder in which an opening, an edge that defines the opening, and four fixing parts that are independently provided at four corners of a front surface are formed on the front surface; a cover lens that is provided at a position interposed between the four fixing parts, and is connected to the edge in a region overlapping the edge; and an optical component that is held by the holder and projects or receives light through the opening.

According to this aspect, when the small photoelectric sensor includes four fixing parts independently provided at the four corners of the front surface of the holder, the edge is not surrounded by the fixing parts, the edge is provided on the outer circumference of the front surface of the holder, and the opening can be widened. Therefore, compared to the small photoelectric sensor of the related art, it is possible to increase a capacity for accommodating optical components while maintaining a small outer shape of the small photoelectric sensor. In addition, since the opening can be widened without narrowing the width of the edge, it is possible to secure the capacity for accommodating optical components, it is possible to reliably connect the holder and the cover lens, and it is possible to secure sealing properties.

In the above aspect, the four fixing parts may be provided outside a region in which the cover lens and the edge overlap, and four corners of the cover lens may be fixed with the four fixing parts.

According to this aspect, it is possible to fix the cover lens with a simple configuration without separately providing a component for fixing the cover lens to the holder or the like.

In the above aspect, the front surface of the holder may have a substantially rectangular shape, and the cover lens may have a substantially octagonal shape in which four corners in contact with the four fixing parts are chamfered.

According to this aspect, since the outer shape of the space for accommodating optical components can be formed into a polygonal shape, compared to the small photoelectric sensor of the related art having a substantially circular outer shape, rectangular circuit components and substrates can be efficiently accommodated in the holder.

In the above aspect, the holder may be made of a resin.

According to this aspect, when the holder is made of a resin, even if the holder is made smaller so that it is suitable for a small photoelectric sensor, it is possible to easily form a fine structure.

According to the disclosure, when the cover lens is fixed with four fixing parts independently provided at four corners of the front surface of the holder, it is possible to provide a small photoelectric sensor that can secure a capacity for accommodating an optical component and securing sealing properties.

Exemplary embodiments of the disclosure will be described with reference to the appended drawings. Here, in the drawings, the same reference numerals are used to denote the same or similar components.

Figure 4:
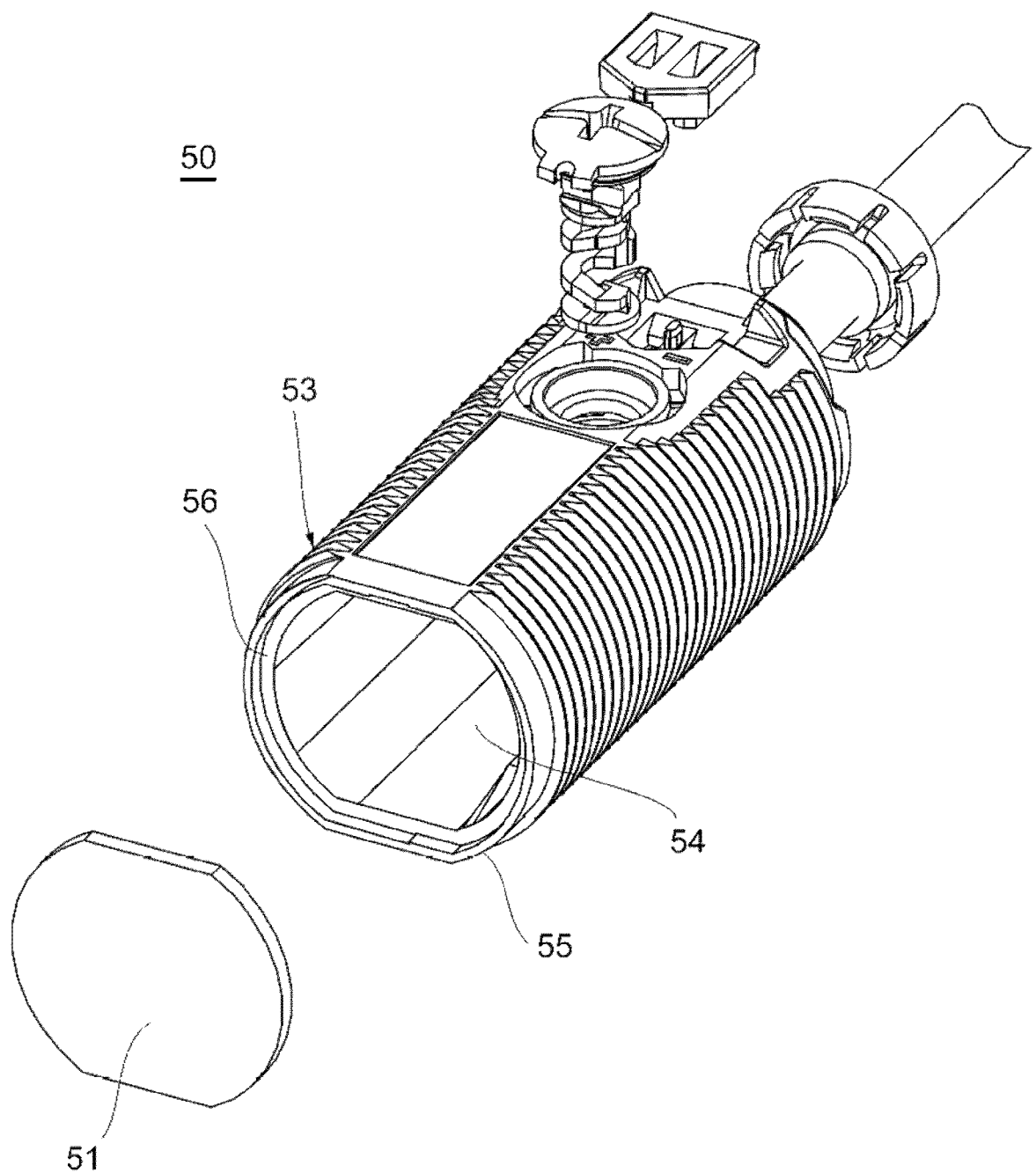
FIG. 4 is an exploded perspective view showing a small photoelectric sensor of the related art.

FIG. 4 is an exploded perspective view showing a small photoelectric sensor 50 of the related art. The small photoelectric sensor 50 includes a cover lens 51, an optical component (not shown), and a holder 53. The small photoelectric sensor 50 accommodates an optical component inside the holder 53, and is assembled by attaching the cover lens 51 to the holder 53.

The cover lens 51 is connected to the holder 53 so that it covers an opening 54 of the holder 53. Specifically, the cover lens 51 that is fitted into an edge 56 which defines the opening 54 of the holder 53, and positioned by a fixing part 55 is connected to the holder 53 using laser welding, ultrasonic welding, or the like (hereinafter referred to as "laser welding or the like").

The optical component is a component of an optical system that projects light or receives light to or from an object to be detected. For example, the optical component is constituted by a light projecting unit including a light projecting element and a light projecting lens and a light receiving unit including a light receiving element and a light receiving lens.

In the holder 53, the opening 54 allowing light projected from an optical component to pass therethrough and introducing light reflected from a detection object, a reflection plate, or the like into the holder, the edge 56 that defines the opening 54 and connects the holder 53 and the cover lens 51, and the fixing part 55 for positioning the cover lens 51 are formed on the front surface.

Figure 5:
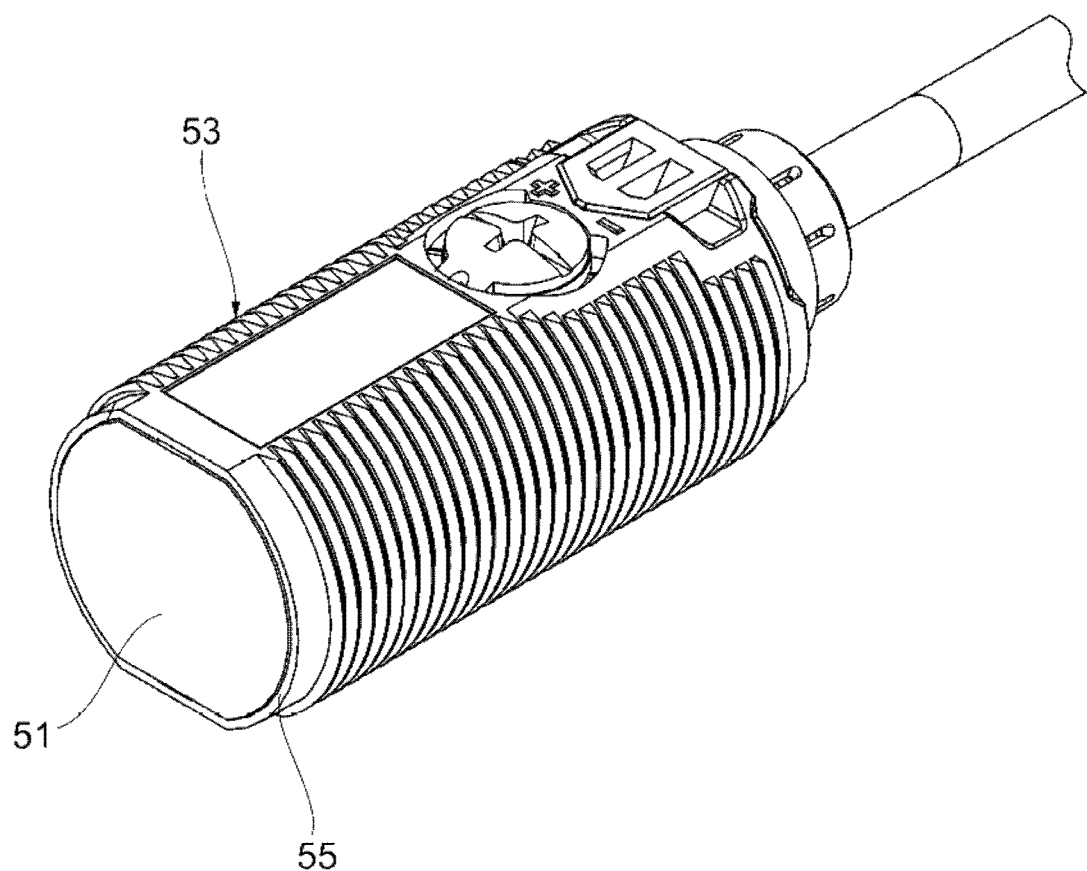
FIG. 5 is a perspective view showing the small photoelectric sensor of the related art.

FIG. 5 is a perspective view showing a state in which the cover lens 51 of the small photoelectric sensor 50 of the related art is attached to the holder 53. The fixing part 55 is formed to surround and fix the entire outer circumference of the cover lens 51 when the cover lens 51 is fitted into the fixing part 55. In addition, the edge 56 is formed to overlap an outer circumferential part of the cover lens 51 when the cover lens 51 is fitted into the fixing part 55 and placed on the edge 56. In the small photoelectric sensor 50, while the cover lens 51 is positioned with the fixing part 55, the edge 56 and the cover lens 51 are connected by laser welding or the like, and thus the optical component accommodated in the holder 53 is sealed.

In the small photoelectric sensor 50 of the related art, the edge 56 is provided to surround the opening 54 of the holder 53, and the fixing part 55 is provided to surround the edge 56. Therefore, when the outer shape of the holder 53 is made smaller while maintaining the width of the edge 56, the capacity for accommodating optical components is reduced.

(1. Overall Configuration)

An overall configuration of a small photoelectric sensor 1 according to the present embodiment will be described with reference to FIG. 1. FIG. 1 is a perspective view showing an exterior of the small photoelectric sensor 1 according to the present embodiment during use. For convenience of explanation, the front, back, left, right, up and down are based on those shown in FIGS. 1 and 2.

The small photoelectric sensor 1 is a sensor for detecting whether there is an object or the like according to projection or reception of light. The small photoelectric sensor 1, for example, includes a housing 2 as shown in FIG. 1.

The housing 2 is made of, for example, a resin or a metal, and has a substantially rectangular parallelepiped shape. Inside the housing 2, an optical component (not shown) and a holder 11 for holding the optical component are accommodated. In addition, on the outer surface of the housing 2, an indicating lamp 5a and an indicating lamp 5b for displaying an operation state of the small photoelectric sensor 1 (hereinafter collectively referred to as "indicating lamps 5") are provided. The operation state includes, for example, a power supply state and a detection state of the small photoelectric sensor 1, but any state may be included according to applications of the small photoelectric sensor 1. The indicating lamp 5 may include, for example, a light emitting element such as an LED element.

On the front surface of the housing 2, an opening (not shown) for allowing light projected or received to pass therethrough is provided. A cover lens 15 covering the opening, four fixing parts 12a, 12b, 12c, and 12d (hereinafter collectively referred to as "fixing parts 12") for fixing the cover lens 15 at four corners, and the like are fitted. In such a configuration, the small photoelectric sensor 1 emits light from the optical component accommodated in the housing 2 through the cover lens 15, and allows light to enter the optical component through the cover lens 15, and detects whether there is an object or the like.

Figure 2:
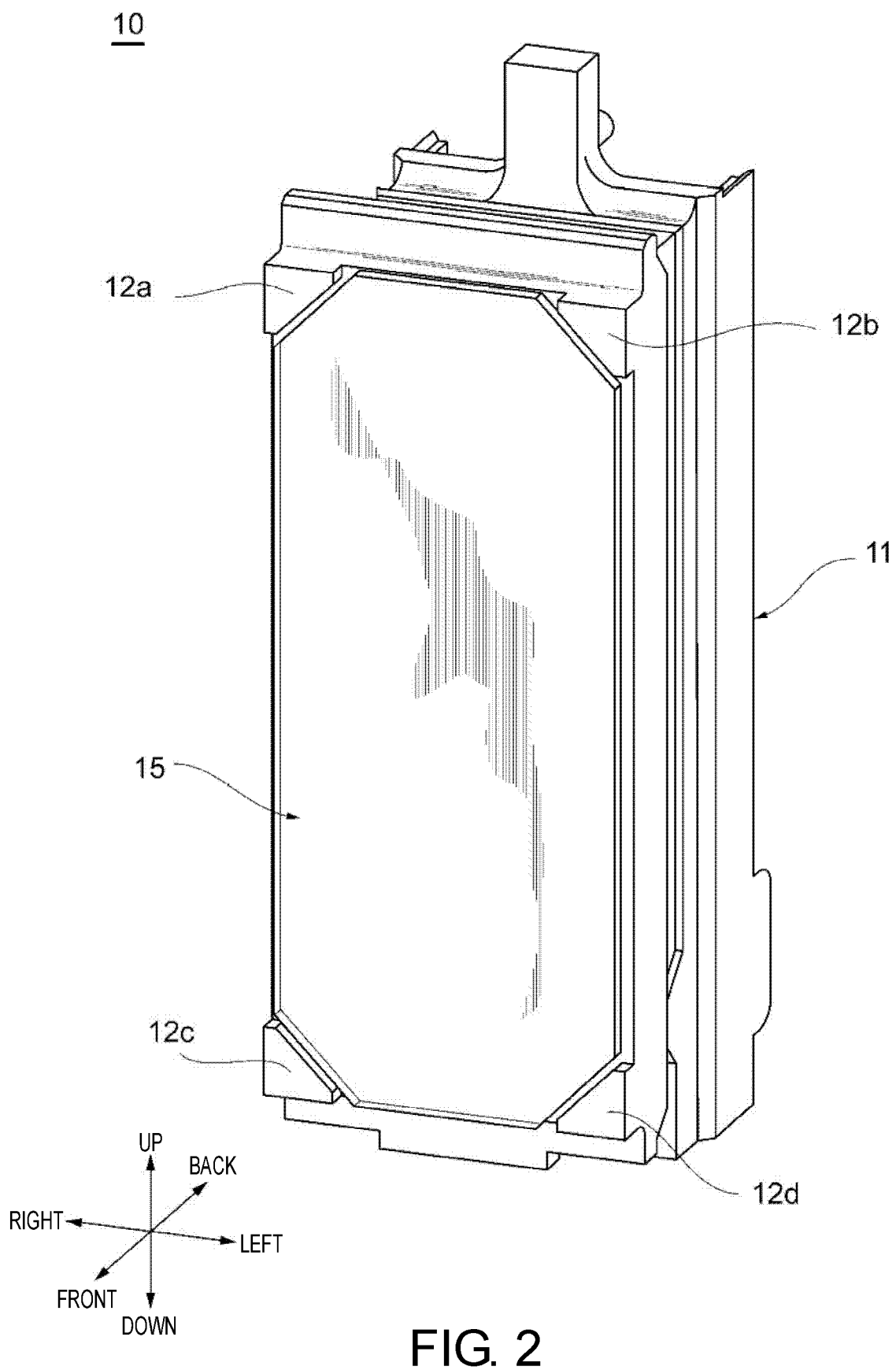
FIG. 2 is a perspective view showing a part of internal components of the small photoelectric sensor in FIG. 1.
Figure 3:
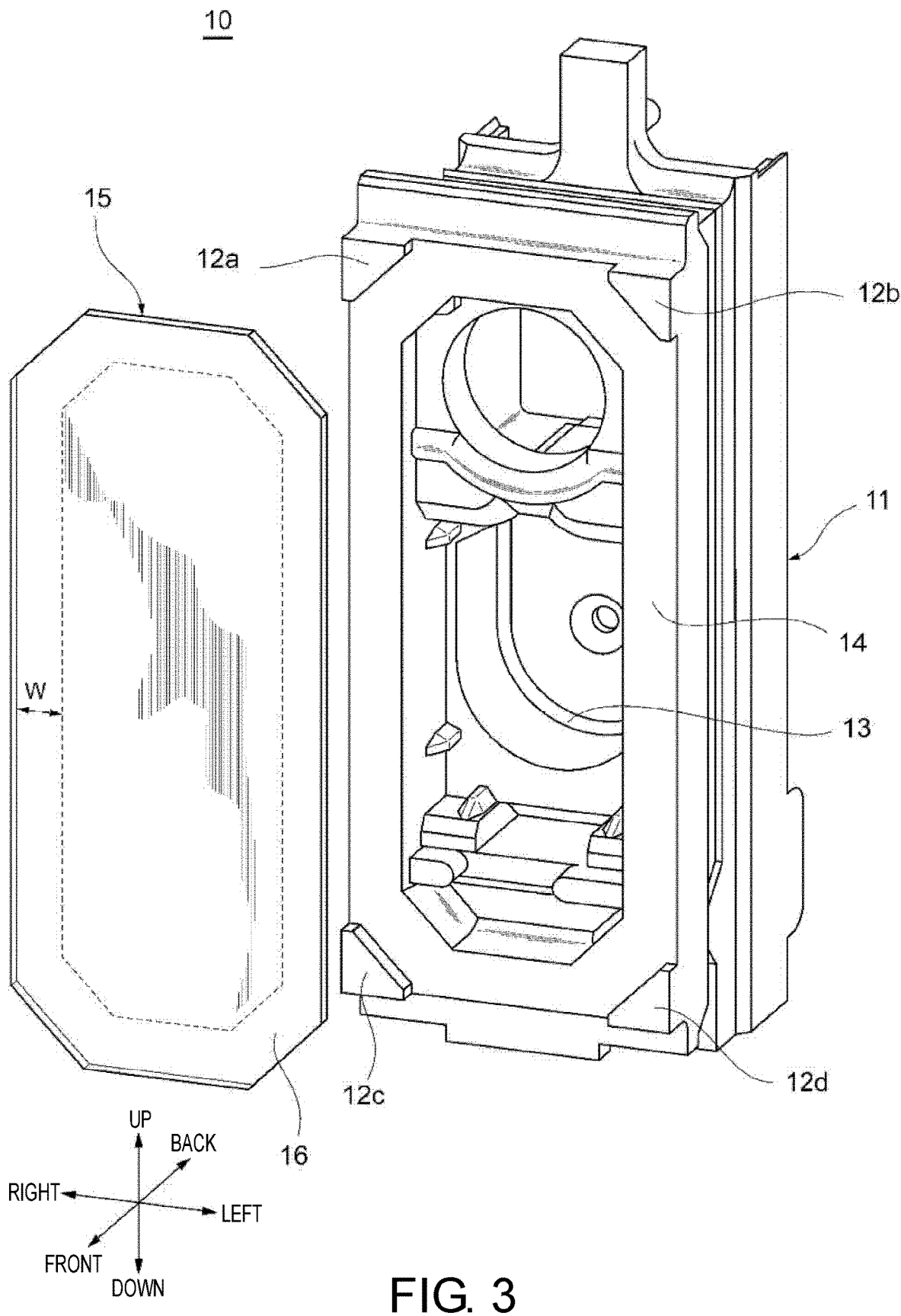
FIG. 3 is an exploded perspective view showing a part of internal components of the small photoelectric sensor in FIG. 1.

Next, the configurations of the holder 11, the optical component, and the cover lens 15 (hereinafter these components are collectively referred to as "internal components 10") which are main constituent components accommodated inside the housing 2 will be described with reference to FIGS. 2 and 3. FIG. 2 is a perspective view showing an exterior of the internal components 10 excluding the optical component during use. FIG. 3 is an exploded perspective view showing the internal components 10 excluding the optical component.

(1-1. Holder)

The holder 11 is a component for holding an optical component. The holder 11 is formed to include an opening 13, an edge 14, and the fixing part 12. The holder 11 may have, for example, a substantially rectangular parallelepiped shape. Here, the fact that the holder 11 has a "substantially rectangular parallelepiped shape" may refer to having a shape having a surface other than six surfaces constituting a rectangular parallelepiped shape, a shape with interior angles that are not all 90 degrees, or a shape that is different from a strict rectangular parallelepiped shape. In addition, a front surface 17 of the holder 11 may have, for example, a substantially rectangular shape. Here, the "front surface" is a surface that faces an object to be detected or a reflection plate in the small photoelectric sensor 1 and the internal components 10, and projects and receives light from the front surface 17.

In addition, the holder 11 may be made of, for example, a resin, and made of, specifically, PBT, PC, ABS, PMMA, PAR, or the like. In addition, the holder 11 may be made of a thermoplastic resin, and may be formed by filling a resin into a mold. When the holder 11 is made of a resin, even if the holder 11 is made smaller so that it is suitable for the small photoelectric sensor 1, it is possible to easily form a fine structure. In addition, when the holder 11 is made of a resin, the holder 11 and the cover lens 15 can be connected by laser welding or the like without using an adhesive.

Four fixing parts 12 are independently provided at four corners of the front surface 17 of the holder 11 and position the cover lens 15. The fixing part 12 may be provided outside a region in which the cover lens 15 and the edge 14 overlap. In addition, the fixing parts 12 may be, for example, ribs provided at the four corners of the front surface 17 of the holder 11. Here, the "rib" is a component protruding to the front surface 17 with respect to other components such as the edge 14. When the fixing parts 12 are ribs, the cover lens 15 is fitted and fixed between the ribs. In such a configuration, it is possible to fix the cover lens 15 with a simple configuration without separately providing a component for fixing the cover lens 15 or the like.

When the fixing part 12 is a rib, the height of the rib (the length of a part that protrudes from the front surface 17) may be substantially the same as the thickness of the cover lens 15. For example, when the height of the rib and the thickness of the cover lens 15 vary, a step is generated, and in a state in which the small photoelectric sensor 1 shown in FIG. 1 is used, dirt is likely to accumulate in the step, and it is difficult to remove dirt adhered to the cover lens 15 due to the step. When the height of the fixing part 12 and the thickness of the cover lens 15 are set to be substantially the same, it is possible to provide the small photoelectric sensor 1 that is unlikely to become dirty and in which dirt is easily removed.

The opening 13 is formed on the front surface 17 of the holder 11, and allows light projected from an optical component to pass therethrough, and introduces light such as light reflected from a detection object or a reflection plate and the like into the holder 11. The opening 13 may have a polygonal shape, and has an outer shape with a substantially octagonal shape in the present embodiment. Here, the opening 13 may have an elliptical shape or a rounded rectangular shape.

The edge 14 defines the opening 13, and becomes a region connecting the cover lens 15 and the holder 11. When the cover lens 15 and the holder 11 at the edge 14 are connected, the optical component held by the holder 11 is sealed. A width W of the edge 14 is a sealing margin for sealing the holder 11 and the cover lens 15. The width W may be constant along the edge 14.

(1-2. Optical Component)

The optical component (not shown) is a component of an optical system that projects or receives light to or from an object to be detected. For example, the optical component is constituted by a light projecting unit including a light projecting element and a light projecting lens and a light receiving unit including a light receiving element and a light receiving lens. The optical component is assembled and held in the holder 11.

(1-3. Cover Lens)

The cover lens 15 is, for example, a component such as a plate-like lens. The cover lens 15 is provided at a position interposed between four fixing parts 12, and is connected to the edge 14 in a region overlapping the edge 14. The cover lens 15 is fixed at four corners with four fixing parts 12, and covers the opening 13 of the holder 11. The cover lens 15 is made of a translucent material and can project or receive light from an optical component. For example, in the cover lens 15, an outer circumferential part indicated by a dotted line shown in FIG. 3 and a solid line showing an outer edge of the cover lens 15 as an area 16 overlapping the edge 14 is connected to the edge 14 in the overlapping area 16 by laser welding or the like.

For example, when the front surface 17 of the holder 11 has a substantially rectangular shape, a surface covering the opening 13 of the cover lens 15 may have a shape that substantially matches a shape in which four corners at which the fixing parts 12 are provided are chamfered. That is, the cover lens 15 may have a substantially octagonal shape in which four corners in contact with the four fixing parts 12 are chamfered. In this case, the outer shape of the edge 14 and the outer shape of the cover lens 15 substantially match. In such a configuration, since the outer shape of the space for accommodating optical components can be formed into a polygonal shape, compared to the small photoelectric sensor 50 of the related art having a substantially circular outer shape, rectangular circuit components and substrates can be efficiently accommodated in the holder 11.

When the small photoelectric sensor 1 according to the present embodiment includes the four fixing parts 12 independently provided at four corners of the front surface 17 of the holder 11, the edge 14 is not surrounded by the fixing part 12, the edge 14 is provided on the outer circumference of the front surface 17 of the holder 11, and the opening 13 can be widened. Therefore, compared to the small photoelectric sensor 50 of the related art, it is possible to increase a capacity for accommodating optical components (in other words, a volume of a space for accommodating optical components) while maintaining a small outer shape of the small photoelectric sensor 1. In addition, according to the small photoelectric sensor 1 of the present embodiment, since the opening 13 can be widened while maintaining a constant width W of the edge 14 without being narrowed, it is possible to secure the capacity for accommodating optical components, it is possible to reliably connect the holder 11 and the cover lens 15, and it is possible to secure sealing properties.

The embodiments described above are provided in order to facilitate understanding of the disclosure, and are not intended to limit the disclosure. Components of the embodiments, and their dispositions, materials, conditions, shapes, sizes, and the like are not limited to those exemplified and can be appropriately changed. In addition, components shown in different embodiments can be partially replaced or combined.

What is claimed is:

1. A small photoelectric sensor comprising:
    a holder in which an opening, an edge that defines the opening, and four fixing parts that are independently provided at four corners of a front surface of the holder are formed on the front surface, wherein the edge is provided on an outer circumference of the front surface;
    a cover lens that is provided at a position interposed between the four fixing parts, and is connected to the edge at a region where the cover lens overlaps with the edge; and
    an optical component that is held by the holder and projects or receives light through the opening.

2. The small photoelectric sensor according to claim 1, wherein the four fixing parts are provided outside a region in which the cover lens and the edge overlap, and
    wherein four corners of the cover lens are fixed with the four fixing parts.

3. The small photoelectric sensor according to claim 2, wherein the front surface of the holder has a substantially rectangular shape, and wherein the cover lens has a substantially octagonal shape in which four corners in contact with the four fixing parts are chamfered.

4. The small photoelectric sensor according to claim 3, wherein the holder is made of a resin.

5. The small photoelectric sensor according to claim 2, wherein the holder is made of a resin.

6. The small photoelectric sensor according to claim 1, wherein the front surface of the holder has a substantially rectangular shape, and
wherein the cover lens has a substantially octagonal shape in which four corners in contact with the four fixing parts are chamfered.

7. The small photoelectric sensor according to claim 6, wherein the holder is made of a resin.

8. The small photoelectric sensor according to claim 1, wherein the holder is made of a resin.

9. The small photoelectric sensor according to claim 1, wherein the four fixing parts are provided as ribs protruding forward of the front surface.

* * * * *